US006480246B1

United States Patent
Muramoto

(10) Patent No.: US 6,480,246 B1
(45) Date of Patent: Nov. 12, 2002

(54) COLOR IMAGE DISPLAY DEVICE

(75) Inventor: Yasuhiko Muramoto, Kanagawa (JP)

(73) Assignee: Fuji Photo Film Co. Ltd., Kanagawa (JP)

(*) Notice: Subject to any disclaimer, the term of this patent is extended or adjusted under 35 U.S.C. 154(b) by 0 days.

(21) Appl. No.: 10/142,830

(22) Filed: May 13, 2002

(30) Foreign Application Priority Data

May 23, 2001 (JP) ........................................ 2001-154322

(51) Int. Cl.[7] .............................................. G01F 1/1335
(52) U.S. Cl. ............................. 349/64; 349/112; 362/31
(58) Field of Search ........................... 349/64, 68, 112; 362/31, 32

(56) References Cited

U.S. PATENT DOCUMENTS 4,386,826 A * 6/1983 Stolov ........................... 349/61
5,504,602 A * 4/1996 Farmer ........................ 349/112
5,825,442 A * 10/1998 Yoneda et al. .............. 349/112

FOREIGN PATENT DOCUMENTS

JP 6-160844 * 6/1994
JP 11-295729 10/1999

* cited by examiner

Primary Examiner—Toan Ton
(74) Attorney, Agent, or Firm—Sughrue Mion, PLLC

(57) ABSTRACT

There is disclosed a color image display device wherein a number of pixel units, each consisting of emitters for emitting color lights of red, green and blue, are arranged on a two-dimensional basis, and control of turn on of the emitters constituting a number of pixel units displays a color image. The color image display device has optical diffusive layers covering fronts of the associated emitters, respectively. The optical diffusive layers are mutually separated for each of the pixel units.

1 Claim, 2 Drawing Sheets

COLOR IMAGE DISPLAY DEVICE

BACKGROUND OF THE INVENTION

1. Field of the Invention

The present invention relates to a color image display device for displaying a color image.

2. Description of the Related Art

Hitherto, in a color image display device for displaying a color image, mixed colors are represented in such a manner that pixels of three primary colors of R (red), G (green) and B (blue) are closely disposed and the pixels are miniaturized. However, when there are displayed a white character of black in a background and reversely a black character of white in a background, it happens that color bleeding occurs on a boundary portion between the background and the characters, because the pixels of three primary colors of R, G and B are independently of one another.

Resolution of a color image display device, which now comes into wide use as a computer use, is generally 1024× 768 pixels or so, or about one and a half times as much as 1024×768 pixels or so. With such an extent of resolution the color bleeding is not almost conspicuous. Recently, however, resolution of a color image display device is enhanced and there has been developed a high class of display device with 4000 pixels in long side. It often happens that such a high resolution of color image display device is used in a medical field and a field of the proof use for printing, and in such utilization fields, there is needed a higher definition of color image display device. Particularly, in the printing field, it often happens that black characters are often used in white background, and thus a quality of color representation of characters is a very important element.

Generally, in a color display device, it often happens that pixels of RGB are regularly arranged, for example, R, G, B, R, G, B, . . .

FIG. 2 is a view showing a pixel arrangement pattern of a conventional color image display device.

FIG. 2 shows a state that pixels of RGB are regularly arranged in the arrow X direction, like, R, G, B, R, G, B, . . . , and are regularly arranged in the arrow Y direction, like, R, R, R, . . . , G, G, G, . . . , B, B, B, . . . In the event that a display of white characters is performed using a color image display having such a pixel arrangement pattern, for example, there is provided such a display that the left end of a non-emissive area 41 expressed by hatched lines in FIG. 2 is subjected to edging of blue owing to an effect of light emission of B pixels 42a of the right end of a character display area 42 at the left side adjacent to the non-emissive area 41. Likely, there is provided such a display that the right end of the non-emissive area 41 is subjected to edging of red owing to an effect of light emission of R pixels 43a of the left end of the character display area 43 at the right side adjacent to the non-emissive area 41. Those regular color bleedings are conspicuous, and thus this is not suitable for the utilization field requiring a strict color representation.

In order to reduce the color bleeding as mentioned above, there is proposed a color image display device in which RGB pixels are arranged in such a manner that RGB pixels are shifted for each line one by one in pixel. In this case, however, there will occur a boundary line of a color bleeding in a slanting direction, and thus this is also conspicuous. Further, there is also proposed a color image display device in which three pixels of RGB are gathered as a triangle to provide pixel units, and the pixel units are regularly arranged. However, also in this case, there will occur a boundary line of a color bleeding in a slanting direction.

SUMMARY OF THE INVENTION

In view of the foregoing, it is an object of the present invention to provide a color image display device capable of preventing occurrence of color bleeding.

To achieve the above-mentioned object, the present invention provides a color image display device wherein a number of pixel units, each consisting of emitters for emitting color lights of red, green and blue, are arranged on a two-dimensional basis, and control of turn on of the emitters constituting a number of pixel units displays a color image, said color image display device comprising:

optical diffusive layers covering fronts of the associated emitters, respectively, said optical diffusive layers being mutually separated for each of the pixel units.

It is noted that the above-mentioned emitters include not only ones emitting color lights of red, green and blue, but also ones in which a color filter is mounted on a liquid crystal and a color filter is mounted on a white color light emitting pixel.

DETAILED DESCRIPTION OF PREFERRED EMBODIMENTS

Embodiments of the present invention will be described with reference to the accompanying drawings.

Figure 1:
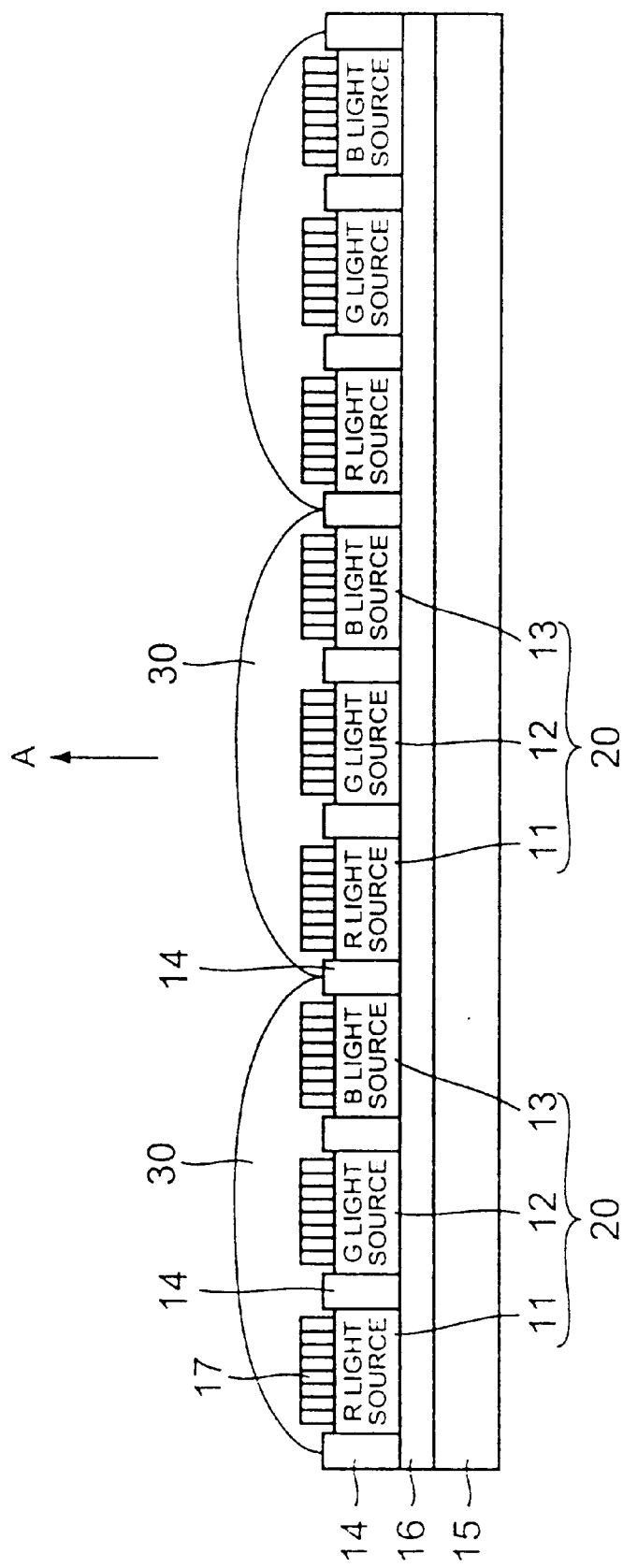
FIG. 1 is a sectional view of a color image display device according to an embodiment of the present invention.
Figure 2:
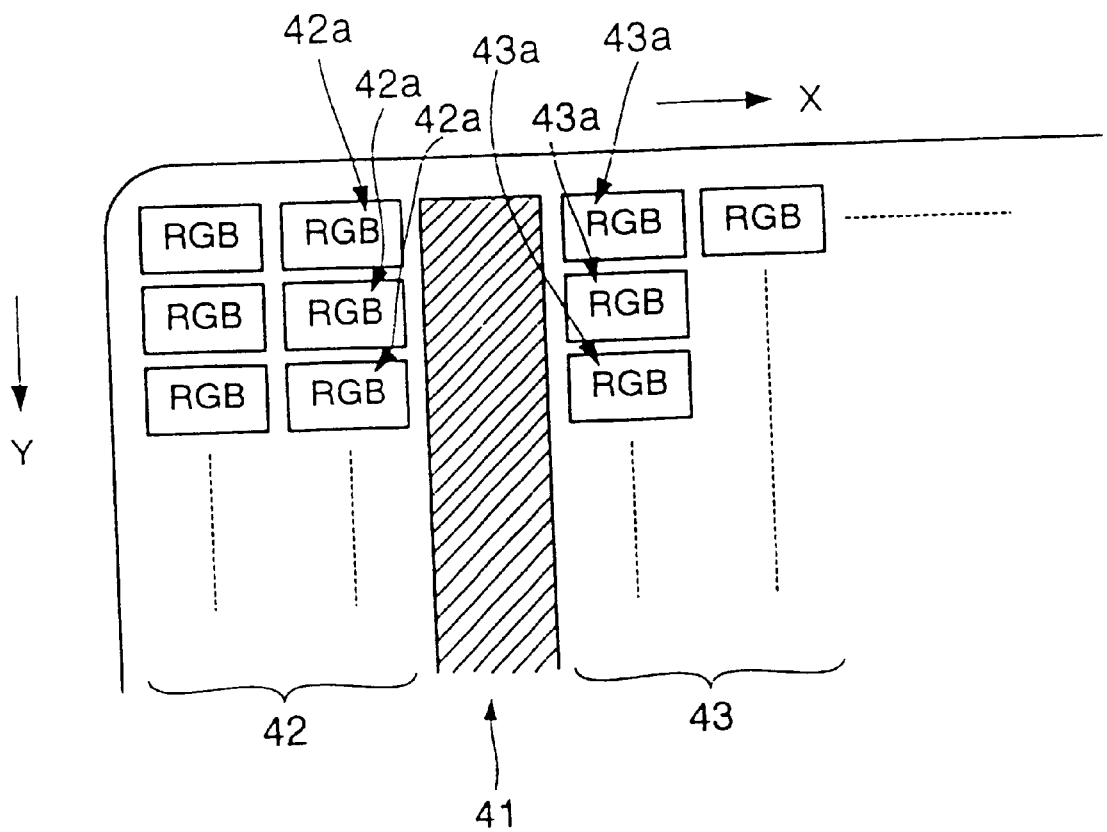
FIG. 2 is a view showing a pixel arrangement pattern of a conventional color image display device.

FIG. 1 is a sectional view of a color image display device according to an embodiment of the present invention.

The present embodiment is an example in which a color image display device of the present invention is applied to an organic EL display device.

As shown in FIG. 1, the organic EL display device has a pixel unit 20 consisting of emitters for emitting color lights of R (red), G (green) and B (blue), that is, R light sources 11, G light sources 12 and B light sources 13. The R light source 11, the G light source 12 and the B light source 13, and a separator 14 for separating those emitters are formed on an anode 16 formed on a substrate 15. A transparent cathode 17 is formed on each of the emitters. And there are formed optical diffusion layers 30 each covering the front of the associated emitter thus formed. The optical diffusion layers 30 are separated for each pixel unit 20.

The pixel units 20 thus constructed are arranged on a two-dimensional basis. Control of turn on of the emitters constituting a large number of pixel units 20 displays a color image in the direction of an arrow A.

As a method of forming the optical diffusion layers 30, it is acceptable that for example, an ink jet system is adopted to spray ink including optical diffusive substance on each of the pixel units 20 so that the optical diffusion layers 30 are formed. Alternatively, it is acceptable that a shadow mask is utilized to deposit optical diffusive substance on all of the pixel units 20, so that the optical diffusion layers 30, which are separated for each pixel unit 20, are formed. Further, alternatively, it is acceptable that optical diffusive transparent resinous layers are coated on all of the pixel units 20 beforehand, and next the ablation is performed by laser light, so that the transparent resinous layers are separated for each pixel unit 20 to form the optical diffusion layers 30 for each pixel unit 20.

As the optical diffusive substance, it is possible to use a mixture of binder resins and the bulking agent. As the binder resins there are given acrylic resins, acid cellulosic resins and epoxy acrylic resins. As the bulking agent, there are given silicic compounds and styrene based compounds.

The mixture of binder resins and the bulking agent is combined with a surface active agent to produce white ink. The optical diffusion layers 30 are formed by ejecting the white ink thus produced from the associated nozzles to the pixel units 20, respectively.

Incidentally, it is acceptable that instead of forming the optical diffusive layers for each of the pixel units according to the above-mentioned way, lights of the pixel units is mutually shut off in accordance with ways in which after the optical diffusive layers covering a plurality of pixel units in its entirety, partition walls of light shielding films or transparent films are formed among the pixel units to mutually separate the pixel units, or blank portions are formed among the pixel units to mutually separate the pixel units.

As mentioned above, according to the color image display device of the present invention, there are provided optical diffusive layers covering the fronts of the associated emitters, respectively, which optical diffusive layers are mutually separated for each pixel unit. This feature makes it possible to prevent color bleedings at the mixed color boundary portions since lights from the respective pixel units are separated, and thus there is no occurrence that the primary color lights of RGB directly reach an observer's eyes.

Although the present invention has been described with reference to the particular illustrative embodiments, it is not to be restricted by those embodiments but only by the appended claims. It is to be appreciated that those skilled in the art can change or modify the embodiments without departing from the scope and sprit of the present invention.

What is claimed is:

1. A color image display device wherein a number of pixel units, each consisting of emitters for emitting color lights of red, green and blue, are arranged on a two-dimensional basis, and control of turn on of the emitters constituting a number of pixel units displays a color image, said color image display device comprising:

optical diffusive layers covering fronts of the associated emitters, respectively, said optical diffusive layers being mutually separated for each of the pixel units.

* * * * *